United States Patent
Lee

(10) Patent No.: US 12,267,999 B2
(45) Date of Patent: Apr. 1, 2025

(54) 3-DIMENSIONAL NAND MEMORY WITH REDUCED THERMAL BUDGET

(71) Applicant: ENTEGRIS, INC., Billerica, MA (US)

(72) Inventor: SungHae Lee, Suwon-si (KR)

(73) Assignee: ENTEGRIS, INC., Billerica, MA (US)

( * ) Notice: Subject to any disclaimer, the term of this patent is extended or adjusted under 35 U.S.C. 154(b) by 503 days.

(21) Appl. No.: 17/626,446

(22) PCT Filed: Jul. 13, 2020

(86) PCT No.: PCT/US2020/041820
§ 371 (c)(1),
(2) Date: Jan. 11, 2022

(87) PCT Pub. No.: WO2021/015978
PCT Pub. Date: Jan. 28, 2021

(65) Prior Publication Data
US 2022/0246639 A1    Aug. 4, 2022

Related U.S. Application Data

(60) Provisional application No. 62/876,120, filed on Jul. 19, 2019.

(51) Int. Cl.
*H10B 43/35* (2023.01)
*H10B 43/27* (2023.01)
*H10B 43/40* (2023.01)

(52) U.S. Cl.
CPC ............. *H10B 43/27* (2023.02); *H10B 43/35* (2023.02); *H10B 43/40* (2023.02)

(58) Field of Classification Search
CPC ........ H10B 43/10; H10B 43/20; H10B 43/23; H10B 43/27; H10B 43/35
See application file for complete search history.

(56) References Cited

U.S. PATENT DOCUMENTS 9,312,271 B2    4/2016  Sawa
9,502,521 B2    11/2016 Lin et al.
(Continued)

FOREIGN PATENT DOCUMENTS

| | | |
|---|---|---|
| JP | 2005268756 A | 9/2005 |
| JP | 2011029576 A | 2/2011 |
| JP | 2012248691 A | 12/2012 |

OTHER PUBLICATIONS

Raj et al., Fabrication techniques and material properties of dielectric MgO thin films—A status review., CIRP Journal of Manufacturing Science and Technology., pp. 92-113., 2010.
(Continued)

*Primary Examiner* — Reema Patel

(57) ABSTRACT

Methods of manufacture and memory cells manufactured according to the methods are described. The manufacture has a lower thermal budget and experiences less heating by including a blocking layer including MgO. The method of manufacture may include annealing following deposition of the MgO, with the annealing occurring at temperatures below 900° C. or below 800° C. The blocking layers may be a first blocking layer made of $SiO_2$ and a second blocking layer made of MgO. The memory cells may have a CMOS Under Array (CuA) structure. The memory cells may be part of a three-dimensional NAND memory device.

19 Claims, 4 Drawing Sheets

(56) References Cited

U.S. PATENT DOCUMENTS

| | | |
|---|---|---|
| 2005/0205920 A1 | 9/2005 | Jeon |
| 2009/0321810 A1 | 12/2009 | Ryu et al. |
| 2011/0101442 A1 | 5/2011 | Ganguly |
| 2012/0112263 A1 | 5/2012 | Tanaka |
| 2012/0299083 A1 | 11/2012 | Toratani |
| 2013/0256777 A1* | 10/2013 | Khoueir ............ H01L 29/42324 257/E21.422 |
| 2015/0200199 A1 | 7/2015 | Sakamoto |
| 2016/0035740 A1 | 2/2016 | Sawa |
| 2016/0351576 A1 | 12/2016 | Yamazaki |
| 2017/0083249 A1 | 3/2017 | Yang |
| 2017/0323900 A1 | 11/2017 | Kanamori |
| 2018/0248022 A1 | 8/2018 | Ye |

OTHER PUBLICATIONS

Sung Heo, et al, "Band gap and defect states of MgO thin films investigated using reflection electron energy loss spectroscopy," AIP Advances 5, 077167 (2015) Jul. 24, 2015.

* cited by examiner

3-DIMENSIONAL NAND MEMORY WITH REDUCED THERMAL BUDGET

CROSS-REFERENCE TO RELATED APPLICATIONS

This application claims the benefit under 35 USC 119 of U.S. Provisional Patent Application No. 62/876,120, filed Jul. 19, 2019, the disclosure of which is hereby incorporated herein by reference in its entirety.

FIELD

This disclosure is directed to manufacturing processes and blocking layers included in NAND flash memory units, particularly the use of MgO blocking layers in three-dimensional NAND flash memory units having a CMOS Under Array design.

BACKGROUND

Many NAND flash memories uses charge trap memory cells to provide non-volatile storage. Three-dimensional NAND (3-D NAND) flash memory devices are typically charge trap flash memory devices that use multiple stacked layers of memory cells to improve density and control scaling of costs. 3-D NAND memory requires a significant amount of space dedicated to supporting circuits such as a wordline staircase.

CMOS Under Array (CuA) is a structure for semiconductor devices that includes integrated circuits, such as the peripheral circuit of a NAND memory unit, below other layers such as the memory cells of a 3-D NAND flash memory device. CuA structures may reduce bit costs, increase chip efficiency, and improve performance.

SUMMARY

This disclosure is directed to manufacturing processes and blocking layers included in NAND flash memory units, particularly the use of MgO blocking layers in three-dimensional NAND flash memory units having a CMOS Under Array design.

One potential structure for 3-D NAND devices is CMOS Under Array (CuA), where at least some integrated circuits of the device are included in layers directly below the NAND cell layers. Since the integrated circuits are located in proximity to the NAND cell layers, processing of the NAND cell layers, such as post-deposition annealing of the high dielectric constant (high-k) oxide in the blocking layer, may lead to degradation of the integrated circuit layers below the NAND layers, such as peripheral circuits of the 3-D NAND device.

By replacing alumina in a 3-D NAND device blocking layer with magnesium oxide (MgO), the required post deposition annealing temperature may be reduced to levels that are less likely to harm the CuA circuits while still preserving bandgap and dielectric properties needed to effectively function as a blocking layer in the charge trap memory. This allows lower temperatures during manufacturing and thus also reduces peripheral circuit degradation during the manufacturing processes.

A method embodiment for manufacture of a NAND memory device includes depositing a channel layer, depositing a tunnel dielectric layer, depositing a trap layer, depositing a first blocking layer comprising $SiO_2$, depositing a second blocking layer comprising MgO on the first blocking layer, annealing the second blocking layer, depositing a barrier metal on the second blocking layer, and depositing a word line material on the barrier metal.

In an embodiment, the channel layer is deposited above an integrated circuit. In an embodiment, the integrated circuit is a peripheral circuit of the NAND memory device.

In an embodiment, the NAND memory device is a three-dimensional NAND memory device.

In an embodiment, a temperature of the NAND memory device does not exceed 900° C. during the method. In an embodiment, a temperature of the NAND memory device does not exceed 800° C. during annealing of the second blocking layer.

In an embodiment, annealing the second blocking layer comprises rapid thermal annealing or furnace annealing.

In an embodiment, depositing the second blocking layer comprises providing a solid phase Mg precursor like bis(cyclopentadienyl)magnesium or a liquid phase Mg precursor like bis(ethylcyclopentadienyl)magnesium or diethyl magnesium.

In an embodiment, the first blocking layer consists of $SiO_2$ and the second blocking layer consists of MgO.

In an embodiment, depositing the first blocking layer comprises atomic layer deposition of $SiO_2$ and depositing the second blocking layer comprises atomic layer deposition of MgO.

In an embodiment, after annealing the second blocking layer, the MgO has a k value of at or about 10 and a bandgap of at or about 7 eV.

In an embodiment, after annealing the second blocking, the MgO is trimmed to a target thickness by any suitable wet chemicals.

In an embodiment, a three-dimensional NAND (3-D NAND) memory device includes an underlying integrated circuit, and a plurality of memory cells disposed above the underlying integrated circuit. The memory cells each include a trap layer, a first blocking layer comprising $SiO_2$, disposed on the trap layer, a second blocking layer comprising MgO, disposed on the first blocking layer, and a barrier metal disposed on the second blocking layer.

In an embodiment, the second blocking layer does not include silica. In an embodiment, the second blocking layer consists of MgO.

In an embodiment, wherein the MgO is crystallized MgO. In an embodiment, the crystallinity of MgO is improved from amorphous or poorly crystallized phase via rapid thermal annealing at a temperature of 900° C. or less. In an embodiment, the crystallinity of MgO is improved from amorphous or poorly crystallized phase via rapid thermal annealing or furnace annealing at a temperature of 800° C. or less.

In an embodiment, the MgO has a k value of at or about 10 and a bandgap of at or about 7 eV.

In an embodiment, each of the memory cells further includes a channel layer and a tunnel dielectric layer.

DRAWINGS

DETAILED DESCRIPTION

This disclosure is directed to manufacturing processes and blocking layers included in NAND flash memory units, particularly the use of MgO blocking layers in three-dimensional NAND (3-D NAND) flash memory units having a CMOS Under Array (CuA) design.

Figure 1:
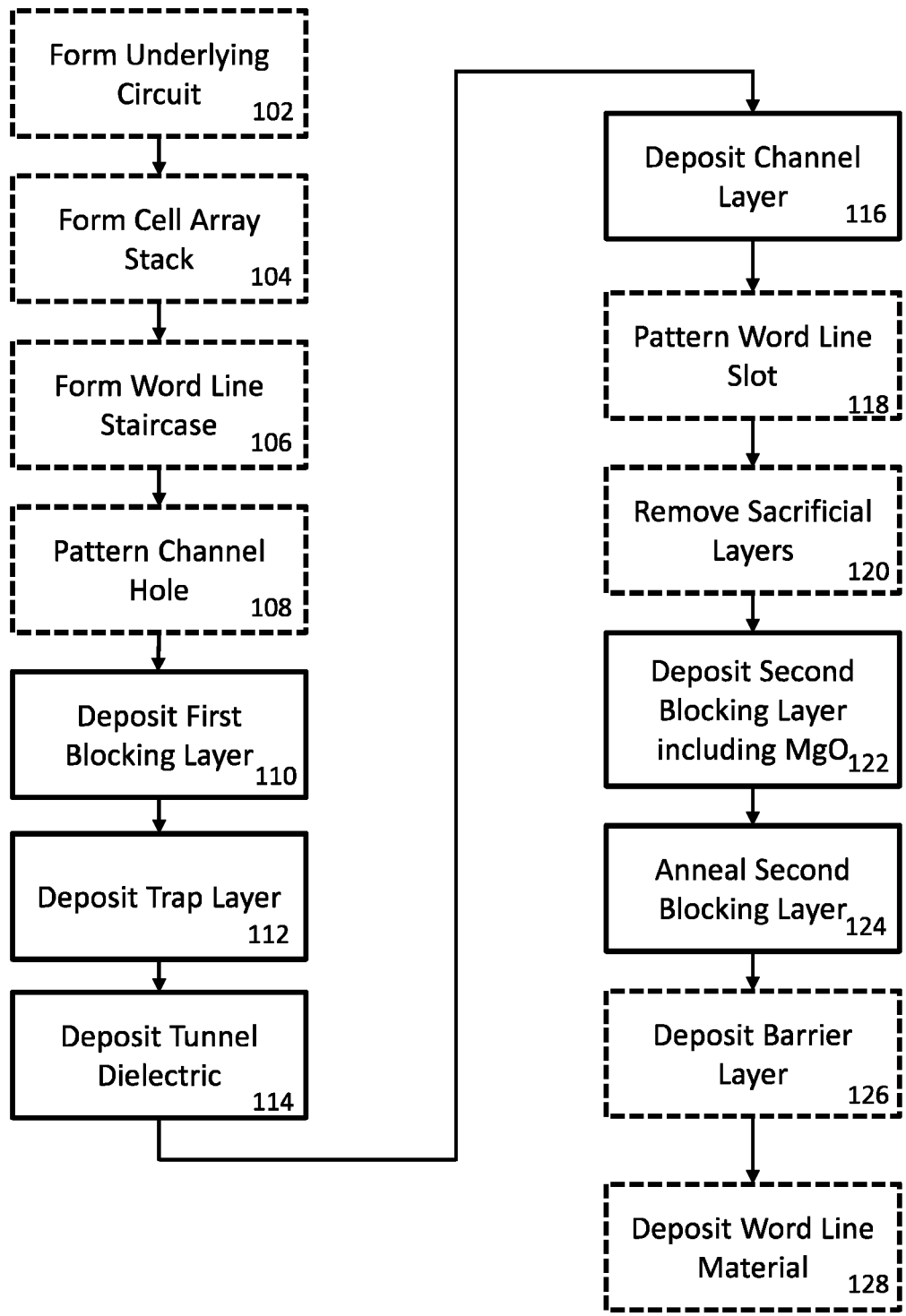
FIG. 1 shows a flowchart of a method of manufacturing a NAND device according to an embodiment.

FIG. 1 shows a flowchart of a method 100 of manufacturing a NAND device according to an embodiment. Method 100 may include forming an underlying circuit 102. Method 100 may further optionally include forming a cell array stack 104, forming a word line staircase 106, and patterning a channel hole 108. Method 100 includes depositing a first blocking layer 110. Method 110 further includes depositing a trap layer 112 on the first blocking layer deposited at 110. Method 110 further includes depositing a tunnel dielectric 114, and depositing a channel layer 116. Optionally, for higher stacking, sequences 104 through 116 or 104 through 118 may be implemented two or more times. Optionally, method 100 includes patterning a word line slot 118. Method 100 also includes depositing a second blocking layer 122, which contains MgO, on the first blocking layer deposited at 110. Method 100 further includes annealing the second blocking layer 124. Method 100 may also include depositing a barrier metal 126 on the second blocking layer, and optionally further include depositing word line material 128 on the barrier metal deposited at 126.

Optionally, method 100 includes forming an underlying circuit 102. The underlying circuit formed at 102 may be an integrated circuit. In an embodiment, the underlying circuit includes a complementary metal oxide semiconductor (CMOS). The memory cells of the NAND device may then be deposited above the underlying circuit, for example to result in the structure shown in FIG. 3 and described below. The underlying circuit may include one or more elements that are temperature-sensitive. In an embodiment, the one or more temperature-sensitive elements include a peripheral circuit of the NAND device formed by method 100. The temperature-sensitive elements may, for example, be susceptible to degradation or agglomeration at temperatures exceeding 900° C.

Method 100 may optionally further include forming a cell array stack 104, forming a word line staircase 106, and patterning a channel hole 108. Forming the cell array stack at 104 may include depositing alternating dielectric layers, for example dielectric pairs of $SiO_2$ and SiN layers to form a stack of those alternating dielectric layers. A word line staircase may optionally be formed at 106. The word line staircase formed at 106 may provide connections to the word line for multiple vertically stacked memory cells in a 3-D NAND memory device. Optionally, one or more channel holes may be patterned at 108. Patterning of the channel hole at 108 may be the production of one or more cylindrical holes in the cell array stack formed at 104. The patterning of the one or more channel holes at 108 may be by any suitable patterning method, for example by dry etching. In an embodiment, the one or more channel holes patterned at 108 may be perpendicular to the planes of the layers of the cell array stack formed at 104. The cell array stack deposited at 104 and the layers of each memory cell formed in the channel patterned into the cell array stack at 108, including the first blocking layer, trap layer, tunnel dielectric, and channel layer, may be located at positions above the underlying circuit formed at 102. The positions above the underlying circuit may include any positions vertically above the underlying circuit, for example positions separated from the underlying circuit by additional layers of materials.

A first blocking layer is deposited 110. The first blocking layer may be deposited within the one or more channel holes formed via patterning at 108. The first blocking layer may be an oxide. In an embodiment, the first blocking layer deposited at 110 is $SiO_2$. In an embodiment, the first blocking layer is deposited 110 by ALD.

A trap layer is deposited 112. The trap layer deposited at 112 may be a non-conductive material. The trap layer deposited at 112 may include a charge-trapping material, such as silicon nitride. The trap layer may be deposited 112 by any suitable deposition method, for example, atomic layer deposition (ALD). The trap layer may be deposited on the first blocking layer deposited at 110.

A tunnel dielectric layer is deposited 114. The tunnel dielectric layer deposited at 114 is non-conductive and includes at least one dielectric material, such as $SiO_2$ or $SiO_xN_y$. In an embodiment, the tunnel dielectric layer is $SiO_xN_y$. The tunnel dielectric layer may have a thickness such that it prohibits direct tunneling from the trap layer. For example, the tunnel dielectric layer deposited at 114 may have a thickness between at or about 50 Angstroms to at or about 70 Angstroms. The tunnel dielectric layer may be deposited 106 by, for example, ALD.

A channel layer is deposited 116. The channel layer may be deposited in a channel hole that is formed above the underlying circuit formed at 102. The channel layer deposited at 116 may be any suitable conducting material for a NAND memory cell. In an embodiment, the channel layer is a conductive poly-silicon material. The channel layer deposited at 116 may be deposited by any suitable deposition technique, for example, low-pressure chemical vapor deposition (LPCVD).

Optionally, method 100 includes patterning a word line slot 118. Patterning the word line slot 118 includes patterning a trench in the cell array stack formed at 104. In an embodiment, the word line slot patterned at 118 is a trench formed over the word line staircase formed at 106. The word line slot patterned at 118 may be patterned using any suitable patterning method, for example by dry etching. In an embodiment, the word line slot is parallel to the one or more channel holes patterned at 108.

Optionally, after patterning the word line slot 118, sacrificial layers of the cell array stack formed at 104 may be removed 120. The sacrificial layers may be removed by any suitable patterning method, for example wet etching.

A second blocking layer is deposited 122. The second blocking layer deposited at 122 may be deposited on the first blocking layer deposited at 110. The second blocking layer deposited at 110 may include MgO. In an embodiment, the second blocking layer deposited at 122 is made entirely of MgO. In an embodiment, the second blocking layer deposited at 112 does not include $Al_2O_3$. In an embodiment, the second blocking layer deposited at 122 does not include $SiO_2$. The second blocking layer may be deposited 122 by ALD. The second blocking layer may be deposited 122 by a process using a solid Mg precursor or a liquid Mg precursor. In some embodiments, the solid phase Mg precursor can be bis(cyclopentadienyl)magnesium. In some embodiments, the liquid phase Mg precursor can be bis(ethylcyclopentadienyl)magnesium or diethyl magnesium.

The second blocking layer is annealed 124. The annealing at 124 may be any suitable annealing method, for example rapid thermal annealing (RTA) or furnace annealing. The annealing may be performed by heating the second blocking layer to a target temperature for a predetermined amount of time. The target temperature may be less than 900° C. In an embodiment, the target temperature may be less than 800° C. In another embodiment, the target temperature may be less than 600° C. The annealing at 124 may allow crystallization of MgO in the second blocking layer to achieve a target k-value higher than the k-value of amorphous MgO. The annealing at 124 and resulting crystallization may also achieve a target bandgap, wider than the bandgap of amorphous MgO. In an embodiment, the target k-value (i.e. the target dielectric constant) and target bandgap are similar to the k-value and bandgap of $Al_2O_3$. In an embodiment, the target k-value is at or about 10. In an embodiment, the target bandgap is at or about 7 eV. Optionally, after annealing the second blocking, the MgO may be trimmed to a target thickness by any suitable wet chemicals after the film is deposited thicker than a target value.

Method 100 may further include depositing a barrier metal 126 on the second blocking layer deposited at 122. In an embodiment, the barrier metal is deposited 126 following annealing of the second blocking layer at 124. The barrier metal deposited at 126 may include any suitable material or materials for a gate in a circuit, such as TaN, TiN, or the like. In an embodiment, the barrier metal is TiN. In an embodiment, the barrier metal is deposited 126 via ALD.

Optionally, method 100 may further include depositing word line material 128. The word line material may be deposited at 118 such that it contacts the barrier metal deposited at 126. The word line material may include one or more of tungsten, molybdenum, cobalt, and ruthenium. In an embodiment, the word line material deposited at 128 is tungsten. In an embodiment, the word line material is deposited 128 by ALD.

Figure 2:
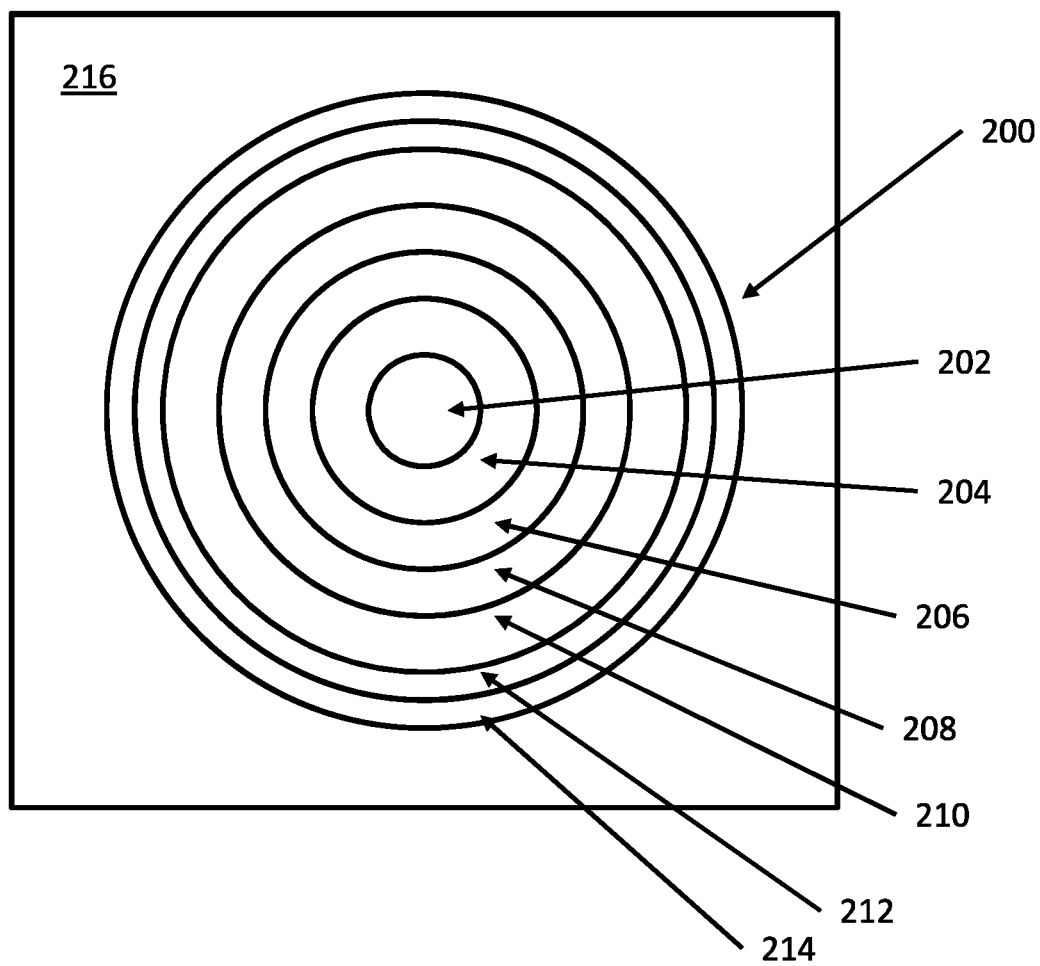
FIG. 2 shows a section view of a memory cell of a NAND device according to an embodiment.

FIG. 2 shows a section view of a memory cell 200 of a NAND device according to an embodiment. In the embodiment shown in FIG. 2, memory cell 200 is cylindrical, and the layers are concentric with one another. In the embodiment shown in FIG. 2, the center is an oxide fill 202. A channel layer 204 surrounds the oxide fill 202. A tunnel dielectric 206 surrounds the channel layer 204. A trap layer 208 surrounds the tunnel dielectric 206. A first oxide barrier layer 210 surrounds the trap layer 208. A second oxide barrier layer 212 surrounds the first oxide barrier layer 210. A barrier metal 214 surrounds the second oxide barrier layer 212. A word line material 216 contacts the barrier metal 214. Memory cell 200 may be located within or through a channel hole formed in the NAND device. The channel may be formed perpendicular to a stack of alternating conductive and dielectric layers. In an embodiment, the memory cell 200 may be formed from the outside of a channel inwards, such that each layer is deposited on the layer outside of it. In an embodiment, successive layers are deposited within the layer outside of it, such that a layer is deposited inside the layer immediately surrounding it.

Oxide fill 202 may form the center of memory cell 200. Oxide fill 202 may be deposited on channel layer 204 during formation of the memory cell 200. Oxide fill 202 may include one or more non-conductive materials, for example, $SiO_2$.

Channel layer 204 surrounds oxide fill 202. Channel layer 204 may be a conductive material. In an embodiment, channel layer 204 is a conductive polysilicon material. Channel layer 204 may be configured to allow conduction of current in proximity to tunnel dielectric 206. Channel layer 204 may be deposited on tunnel dielectric 206 during formation of memory cell 200.

Tunnel dielectric 206 surrounds channel layer 204. Tunnel dielectric is a dielectric material. Tunnel dielectric 206 may be, for example, a non-conductive material such as an oxide. In an embodiment, tunnel dielectric 206 may include one or more oxide materials. In an embodiment, tunnel dielectric 206 may include $SiO_2$. Tunnel dielectric 206 may have a thickness sufficient to prohibit direct tunneling through the tunnel dielectric 206. In an embodiment, the thickness of tunnel dielectric is between at or about 50 Angstroms to at or about 70 Angstroms. Tunnel dielectric 206 may be formed on trap layer 208 during formation of memory cell 200.

Trap layer 208 surrounds tunnel dielectric 206. Trap layer 208 includes a charge-trapping material, such as, for example, silicon nitride. In an embodiment, the charge-trapping materials include a non-conductive material. In an embodiment, trap layer 208 is made of silicon nitride. In an embodiment, trap layer 208 stores electrons that tunnel through tunnel dielectric 206 during a write operation being performed on the memory cell 200. Trap layer 208 may be deposited on first blocking layer 210 during formation of the memory cell 200.

First blocking layer 210 surrounds trap layer 208. First blocking layer 210 may include one or more oxides. In an embodiment, first blocking layer 210 includes $SiO_2$. In an embodiment, first blocking layer 210 is entirely $SiO_2$. First blocking layer 210, along with second blocking layer 212, form a non-conductive barrier between trap layer 208 and a gate electrode formed by barrier metal 214 and word line material 216. First blocking layer 210 may be formed on an inside of a channel that is formed during formation of the memory cell 200.

Second blocking layer 212 surrounds first blocking layer 210. Second blocking layer 212 includes MgO. In an embodiment, second blocking layer 212 is entirely MgO. In an embodiment, second blocking layer 212 does not include $Al_2O_3$. In an embodiment, second blocking layer 212 does not include $SiO_2$. In an embodiment, second blocking layer 212 is a high-constant (high-k) dielectric layer combined with first blocking layer 210 to form the blocking structure for memory cell 200 between trap layer 208 and the gate electrode formed by barrier metal 214 and word line material 216. Second blocking layer 212 may be formed on first blocking layer 210.

Second blocking layer 212 may have a crystalline structure achieved by annealing of the second blocking layer. The crystalline structure may result from rapid thermal annealing (RTA) of the MgO in the second blocking layer. The crystalline structure may provide the characteristics allowing the second blocking layer 212 to be suitable for function as the high-k layer in the blocking structure for memory cell 200. In an embodiment, the crystalline structure of the MgO may result from RTA or furnace annealing at a temperature of less than 900° C. In an embodiment, the crystalline structure of the MgO may result from RTA at a temperature of less than 800° C. In another embodiment, the crystalline structure of the MgO may result from RTA at a temperature of less than 600° C. The crystalline structure of the MgO may provide a dielectric constant k-value of at or about 10. The crystalline structure of the MgO may provide a bandgap of at or about 7 eV or at or about 8 eV.

Barrier metal 214 surrounds second blocking layer 212. The barrier metal 214 may include any suitable material or materials for a gate in a circuit, such as TaN, TiN, or the like. In an embodiment, the barrier metal 214 includes TiN. In an embodiment, the barrier metal 214 is composed entirely of TiN.

Word line material 216 contacts barrier metal 214. The word line material 216 may include, for example, tungsten. In an embodiment, the word line material 216 is tungsten. Word line material 216 connects to a line of the NAND device such that memory cell 200 provides storage of information that can be accessed and read as part of the storage capabilities of the NAND device.

Figure 3:
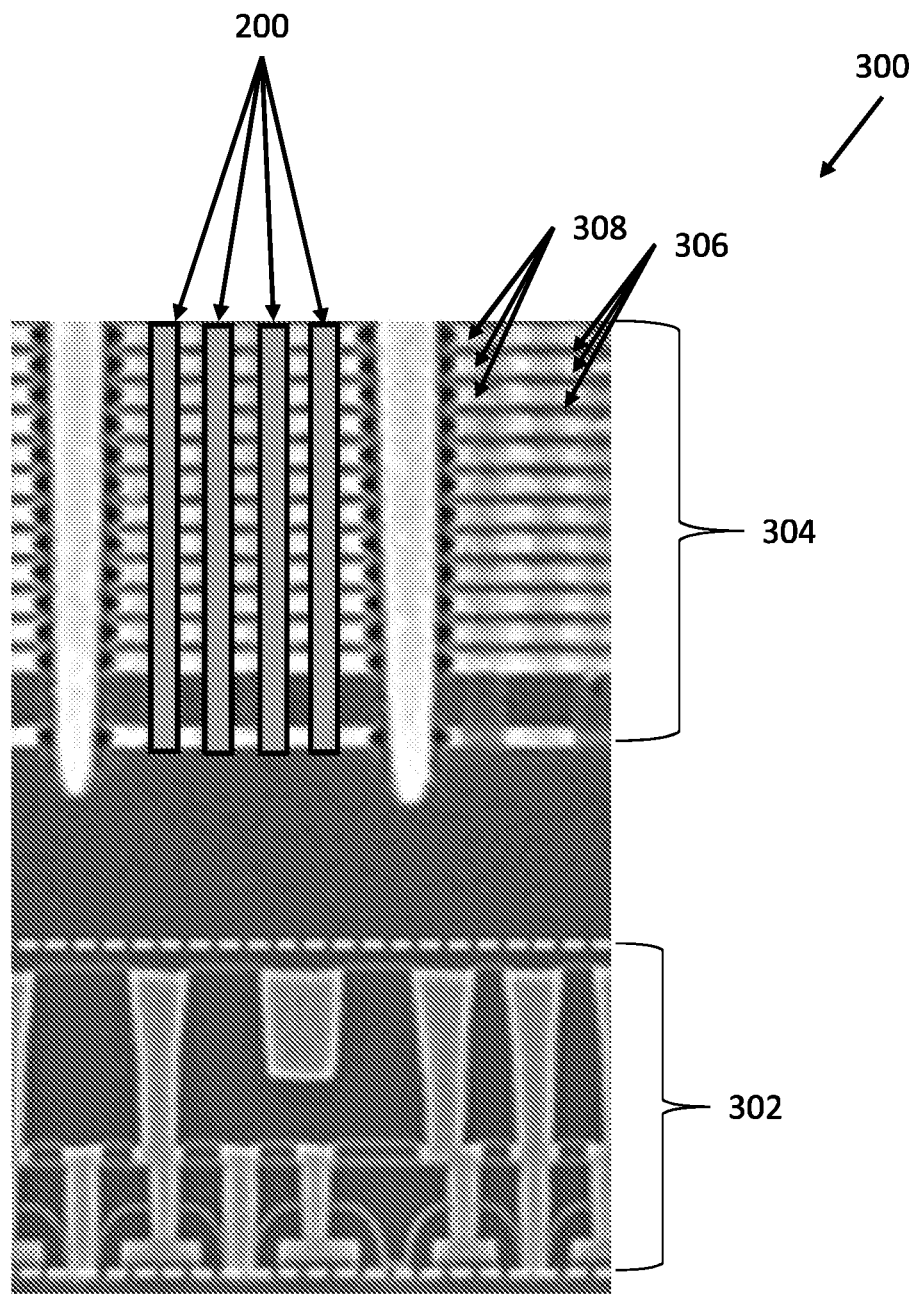
FIG. 3 shows a schematic of a 3-D NAND device according to an embodiment.

FIG. 3 shows a schematic of a 3-D NAND device 300 according to an embodiment. 3-D NAND device 300 has a CuA structure. NAND device 300 includes an underlying circuit 302, and a plurality of memory cells 200. The memory cells 200 may be disposed in a layer structure 304 composed of alternating dielectric layers 306 and conductive layers 308.

Underlying circuit 302 may include one or more integrated circuits. In an embodiment, the one or more integrated circuits include CMOS circuits. The underlying circuit 302 may include one or more circuits for controlling or interpreting the content of the memory cells 200 of 3-D NAND device 300. In an embodiment, the underlying circuit 302 includes one or more peripheral circuits of the 3-D NAND device. In an embodiment, underlying circuit 302 may include one or more elements that are heat sensitive, for example the one or more heat sensitive elements being susceptible to agglomeration at temperatures above 900° C. In an embodiment, the one or more heat sensitive elements include the peripheral circuit of the NAND device 300.

The plurality of memory cells 200 are the memory cells shown in the section view of FIG. 2 and described above. Each of the plurality of memory cells 200 are cylindrical in shape and extend away from underlying circuit 302. In the embodiment shown in FIG. 3, memory cells 200 extend perpendicular to the plane of underlying circuit 302. The plurality of memory cells 200 may be operatively connected to underlying circuit 302 such that the plurality of memory cells 200 may be controlled or have their contents interpreted by underlying circuit 302.

The plurality of memory cells 200 may be disposed in channels through layer structure 304. Layer structure 304 composed of alternating dielectric layers 306 and conductive layers 308. In an embodiment, dielectric layers 306 are Sift. In an embodiment, the conductive layers 308 are tungsten. In an embodiment, the conductive layers 308 function as control gates for the memory cells 200 in the 3-D NAND device 300.

EXAMPLE

Figure 4:
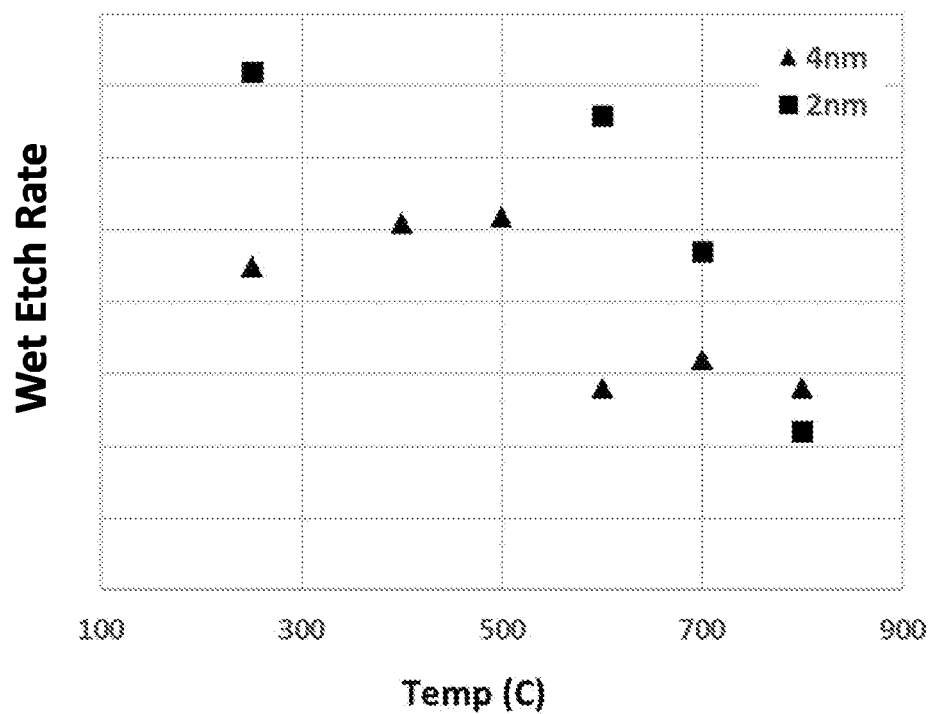
FIG. 4 shows wet etch rates, which reflect crystallinity indirectly, of MgO deposited with 2 nm and 4 nm thickness annealed at various temperatures.

Films of MgO in a thickness of either 2 nm or 4 nm were deposited at 250° C. on a number of silicon substrates. The films were then annealing by heating at temperatures ranging from about 400° C. to about 800° C. as shown in the plot in FIG. 4. After annealing the etch rate of the MgO films were measured by measuring the thickness of the MgO films before and after etching. Etch rate was measured because it is an indirect measurement of the crystallinity of the MgO film with lower etch rates generally having greater crystallinity. Greater crystallinity is believed to lead to a greater dielectric constant k-value and greater bandgap. The relative etch rate results shown in FIG. 4 indicate that the 4 nm MgO films are highly crystallized starting at an annealing temperature of about 600° C. and the 2 nm MgO films are highly crystallized starting at an annealing temperature of about 800° C.

Aspects:

It is understood that any of aspects 1-11 can be combined with any of aspects 12-19.

Aspect 1. A method of manufacturing a NAND memory device, comprising:
depositing a channel layer;
depositing a tunnel dielectric layer;
depositing a trap layer;
depositing a first blocking layer comprising $SiO_2$;
depositing a second blocking layer comprising MgO on the first blocking layer;
annealing the second blocking layer;
depositing barrier metal on the second blocking layer; and
depositing a word line material on the barrier metal.

Aspect 2. The method according to aspect 1, wherein the channel layer is deposited above an integrated circuit.

Aspect 3. The method according to aspect 2, wherein the integrated circuit is a peripheral circuit of the NAND memory device.

Aspect 4. The method according to any of aspects 1-3, wherein the NAND memory device is a three-dimensional NAND memory device.

Aspect 5. The method according to any of aspects 1-4, wherein a temperature of the NAND memory device does not exceed 900° C. during the method.

Aspect 6. The method according to any of aspects 1-5, wherein a temperature of the NAND memory device does not exceed 800° C. during the annealing of the second blocking layer.

Aspect 7. The method according to any of aspects 1-6, wherein annealing the second blocking layer comprises one of rapid thermal annealing or furnace annealing.

Aspect 8. The method according to any of aspects 1-7, wherein depositing the second blocking layer comprises providing a solid phase Mg precursor or a liquid phase Mg precursor.

Aspect 9. The method according to any of aspects 1-8, wherein the first blocking layer consists of $SiO_2$ and the second blocking layer consists of MgO.

Aspect 10. The method according to any of aspects 1-9, wherein depositing the first blocking layer comprises atomic layer deposition of $SiO_2$ and depositing the second blocking layer comprises atomic layer deposition of MgO.

Aspect 11. The method according to any of aspects 1-10, wherein after annealing the second blocking layer, the MgO has a k value of at or about 10 and a bandgap of at or about 7 eV.

Aspect 12. A three-dimensional NAND (3-D NAND) memory device, comprising:
an underlying integrated circuit; and
a plurality of memory cells disposed above the underlying integrated circuit, the memory cells each comprising:
a trap layer;
a first blocking layer comprising $SiO_2$;
a second blocking layer comprising MgO, disposed on the first blocking layer; and
a barrier metal disposed on the second blocking layer.

Aspect 13. The 3-D NAND memory device according to aspect 12, wherein the second blocking layer does not include silica.

Aspect 14. The 3-D NAND memory device according to any of aspects 12-13, wherein the second blocking layer consists of MgO.

Aspect 15. The 3-D NAND memory device according to any of aspects 12-14, wherein the MgO is crystallized MgO.

Aspect 16. The 3-D NAND memory device according to aspect 15, wherein the crystallinity of MgO is improved via annealing at a temperature of 900° C. or less.

Aspect 17. The 3-D NAND memory device according to aspect 15, wherein the crystallinity of MgO is improved via annealing at a temperature of 800° C. or less.

Aspect 18. The 3-D NAND memory device according to any of aspects 12-17, wherein the MgO has a k value of at or about 10 and a bandgap of at or about 7 eV.

Aspect 19. The 3-D NAND memory device according to any of aspects 12-18, wherein each of the memory cells further comprises a channel layer and a tunnel dielectric layer.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A method of manufacturing a NAND memory device, comprising:
    depositing a channel layer;
    depositing a tunnel dielectric layer;
    depositing a trap layer;
    depositing a first blocking layer comprising $SiO_2$;
    depositing a second blocking layer comprising MgO on the first blocking layer;
    annealing the second blocking layer;
    depositing barrier metal on the second blocking layer; and
    depositing a word line material on the barrier metal.

2. The method of claim 1, wherein the channel layer is deposited above an integrated circuit.

3. The method of claim 2, wherein the integrated circuit is a peripheral circuit of the NAND memory device.

4. The method of claim 1, wherein the NAND memory device is a three-dimensional NAND memory device.

5. The method of claim 1, wherein a temperature of the NAND memory device does not exceed 900° C. during the method.

6. The method of claim 1, wherein a temperature of the NAND memory device does not exceed 800° C. during the annealing of the second blocking layer.

7. The method of claim 1, wherein annealing the second blocking layer comprises one of rapid thermal annealing or furnace annealing.

8. The method of claim 1, wherein depositing the second blocking layer comprises providing a solid phase Mg precursor or a liquid phase Mg precursor.

9. The method of claim 1, wherein the first blocking layer consists of $SiO_2$ and the second blocking layer consists of MgO.

10. The method of claim 1, wherein depositing the first blocking layer comprises atomic layer deposition of $SiO_2$ and depositing the second blocking layer comprises atomic layer deposition of MgO.

11. The method of claim 1, wherein after annealing the second blocking layer, the MgO has a k value of at or about 10 and a bandgap of at or about 7 eV. dimensional NAND memory device.

12. A three-dimensional NAND (3-D NAND) memory device, comprising:
    an underlying integrated circuit; and
    a plurality of memory cells disposed above the underlying integrated circuit, the memory cells each comprising:
        a trap layer;
        a first blocking layer comprising $SiO_2$;
        a second blocking layer comprising MgO disposed on the first blocking layer; and
        a barrier metal disposed on the second blocking layer.

13. The 3-D NAND memory device of claim 12, wherein the second blocking layer does not include silica.

14. The 3-D NAND memory device of claim 12, wherein the second blocking layer consists of MgO.

15. The 3-D NAND memory device of claim 12, wherein the MgO is crystallized MgO.

16. The 3-D NAND memory device of claim 15, wherein the crystallinity of MgO is improved via annealing at a temperature of 900° C. or less.

17. The 3-D NAND memory device of claim 15, wherein the crystallinity of MgO is improved via annealing at a temperature of 800° C. or less.

18. The 3-D NAND memory device of claim 12, wherein the MgO has a k value of 10 and a bandgap of 7 eV.

19. The 3-D NAND memory device of claim 12, wherein each of the memory cells further comprises a channel layer and a tunnel dielectric layer.

* * * * *